(12) United States Patent
Grinchuk et al.

(10) Patent No.: US 8,683,291 B2
(45) Date of Patent: Mar. 25, 2014

(54) HIGH THROUGHPUT FRAME CHECK SEQUENCE MODULE ARCHITECTURE

(75) Inventors: Mikhail I. Grinchuk, San Jose, CA (US); Anatoli A. Bolotov, San Jose, CA (US); Lav Ivanovic, Sunnyvale, CA (US)

(73) Assignee: LSI Corporation, Milpitas, CA (US)

( * ) Notice: Subject to any disclaimer, the term of this patent is extended or adjusted under 35 U.S.C. 154(b) by 249 days.

(21) Appl. No.: 13/161,796

(22) Filed: Jun. 16, 2011

(65) Prior Publication Data

US 2012/0324319 A1 Dec. 20, 2012

(51) Int. Cl.
*H03M 13/00* (2006.01)
*G11C 29/00* (2006.01)

(52) U.S. Cl.
USPC ............................................ 714/758; 714/763

(58) Field of Classification Search
USPC ........................................................ 714/758
See application file for complete search history.

(56) References Cited

U.S. PATENT DOCUMENTS

| | | | | |
|---|---|---|---|---|
| 6,223,320 | B1 * | 4/2001 | Dubey et al. | 714/757 |
| 2004/0172582 | A1 * | 9/2004 | Gemelli et al. | 714/781 |
| 2005/0149818 | A1 * | 7/2005 | Tsai et al. | 714/758 |
| 2010/0293345 | A1 * | 11/2010 | Sonnier et al. | 711/154 |
| 2012/0079347 | A1 * | 3/2012 | Ziesler et al. | 714/758 |

OTHER PUBLICATIONS

Al-Shaikhi, A.A.; Ilow, J., "Packet Oriented Error Correcting Codes Using Vandermonde Matrices and Shift Operators," Wireless Communications and Networking Conference, 2008. WCNC 2008. IEEE , vol., No., pp. 261,266, Mar. 31, 2008-Apr. 3, 2008.*
Lee, K.; Hanzo, L., "MIMO-assisted hard versus soft decoding-and-forwarding for network coding aided relaying systems," Wireless Communications, IEEE Transactions on , vol. 8, No. 1, pp. 376,385, Jan. 200.*

* cited by examiner

Primary Examiner — Cynthia Britt

(57) ABSTRACT

Described embodiments provide for a frame check sequence (FCS) module with a cyclic redundancy check (CRC) unit that receives a data block (padded, if necessary, to a maximum width) and a first state vector and computes an internal vector based on an extended CRC transition matrix. The FCS module further includes a set of matrix units, each matrix unit configured to multiply the internal vector by a corresponding correction matrix wherein the multiplications result in a set of products. A multiplexer selects, by a control signal determined by a maximum number of bytes and the original width, a second state vector from the set of products.

19 Claims, 4 Drawing Sheets

400

US 8,683,291 B2

HIGH THROUGHPUT FRAME CHECK SEQUENCE MODULE ARCHITECTURE

BACKGROUND OF THE INVENTION

1. Field of the Invention

The present invention relates to data communications, in particular, to cyclic redundancy check (CRC) computations in a communications processor.

2. Description of the Related Art

Cyclic Redundancy Check (CRC) is an error-detecting code that is commonly used in data communication systems. The CRC error-detecting method employs polynomial computations using arithmetic of finite fields. A frame check sequence (FCS) refers to the result of the CRC algorithm computation that is used and added to a frame in Ethernet/Data link layer and other communication protocols. The FCS is appended to the end of the data transmission to check for errors introduced in the communications channel. The CRC function used in Ethernet is described in the Institute of Electrical and Electronic Engineers (IEEE) Standard 802.3-2008 (herein, "IEEE 802.3").

In general, as described in 3.2.9 of IEEE 802.3, the FCS field in Ethernet contains a 4-octet (32-bit) CRC value. The value is computed as a CRC function of the contents of the protected fields of the MAC frame: destination address, source address, length/type field, MAC client data, and Pad. The encoding is defined by a 32 degree generating polynomial.

The algorithm of the 32-bit FCS computation from IEEE 802.3 can be rewritten so that the input data is represented as a sequence of bytes ($b_1, b_2, b_N$), where N represents the final byte index. Each byte has a corresponding 32-bit state vector, and the final state vector $s_N$ is complemented to produce the FCS, or CRC value. Each state vector is computed with its preceding state vector using the following formula: $s_{i+1} = (s_i \times M) + (b_i \times M^*)$, where i represents the integer index value, M is a given 32×32 matrix, and $M^*$ is an 8×32 sub-matrix of M. In the formula $s_0$ is a given 32-bit constant (e.g., IEEE 802.3 uses the constant where all 32 bits are equal to 1). Further, in this formula and throughout the specification when applied to binary operations with matrices and/or vectors, "+" denotes bitwise addition (bitwise exclusive-or operation) and "×" denotes multiplication of vectors and/or matrices using modulo 2 arithmetic. Operators "+" and "×" have their standard arithmetical meaning, for example, when they are applied to serial numbers of variables or dimensions of matrices.

FCS computations are implemented in software, hardware, or a combination of software and hardware. Often, hardware modules that compute CRC values require input data blocks with a fixed number of bytes. Existing implementations for hardware-approach computations inefficiently increase the gate count in order to perform FCS computations on a variable number of input bytes.

SUMMARY OF THE INVENTION

This Summary is provided to introduce a selection of concepts in a simplified form that are further described below in the Detailed Description. This Summary is not intended to identify key features or essential features of the claimed subject matter, nor is it intended to be used to limit the scope of the claimed subject matter.

Described embodiments provide for a frame check sequence (FCS) module with a cyclic redundancy check (CRC) unit that receives a data block (padded, if necessary, to a maximum width) and a first state vector, and computes an internal vector based on an extended CRC transition matrix. The FCS module further includes a set of matrix units, each matrix unit configured to multiply the internal vector by a corresponding correction matrix, wherein the multiplication results in a set of products. A multiplexer selects, by a control signal that is determined by a maximum number of bytes and an original width of the data block, a second state vector from the set of products.

BRIEF DESCRIPTION OF THE DRAWINGS

Other aspects, features, and advantages of the present invention will become more fully apparent from the following detailed description, the appended claims, and the accompanying drawings in which like reference numerals identify similar or identical elements.

DETAILED DESCRIPTION

In accordance with embodiments of the present invention, an architecture includes a frame check sequence (FCS) module for performing cyclic redundancy check (CRC) computations. A CRC unit in the FCS module produces a state vector value from a data block and state vector value input. The state vector value might be corrected in one or more matrix units, so that the FCS module processes data blocks with varying widths. After correction, a state vector value is selected and stored in a register. The state vector value might be further processed by the CRC unit or be used for error-checking.

Figure 1:
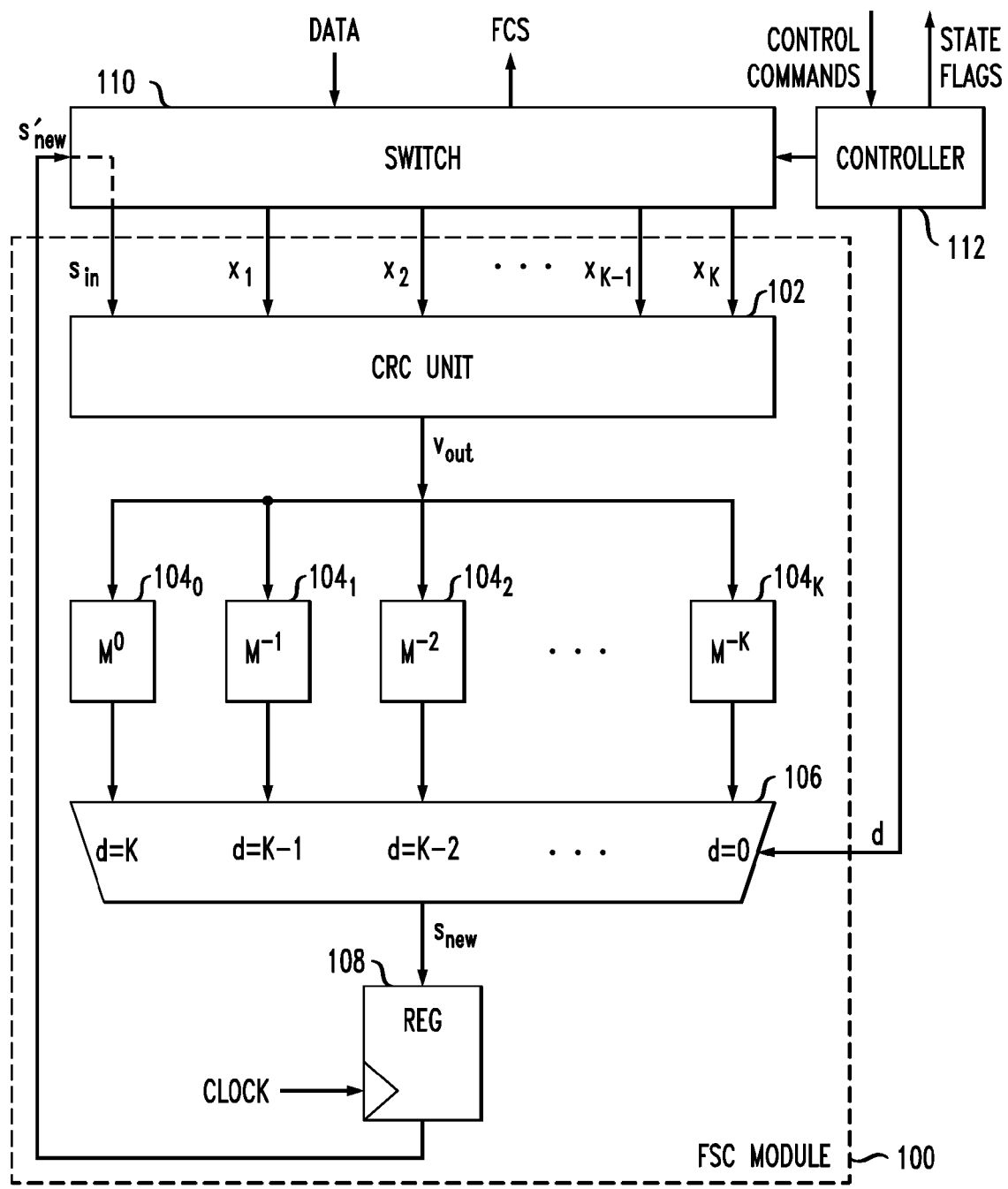
FIG. 1 shows a block diagram of an exemplary frame check sequence module and part of its environment in accordance with exemplary embodiments of the present invention.

FIG. 1 shows a block diagram of an exemplary frame check sequence (FCS) module 100, which might be implemented as a system-on-chip (SoC). As shown in FIG. 1, FCS Module 100 includes cyclic redundancy check (CRC) unit 102, one or more matrix units $104_1$-$104_K$ (where K is an integer greater than or equal to 1), multiplexer 106, and register 108. In preferred embodiments of the present invention, K denotes the maximum number of bytes in each input data block. For example, an input data frame with byte sequence (e.g., $b_1 \ldots b_N$) might be divided into blocks, wherein each block has a width equal to K bytes. FIG. 1 shows a block of K bytes input into CRC unit 102, where the bytes within a block are denoted as $x_1, x_2, \ldots, x_{K-1}, x_K$. In some embodiments, input data blocks might have variable width of up to 32 bytes (256 bits).

Embodiments of the present invention compute a state vector based on input bytes and a previous state vector. After multiple iterations of computing state vectors, the final 32-bit state vector that is computed might represent the final FCS used for error-checking. For example, suppose the computation of state vector $s_t$ starts with initial state vector $s_0$ and processes t bytes of data ($b_1 \ldots b_t$). This computation is denoted as $s_t = FCS(s_0, b_1, \ldots, b_t)$. In these terms, the definition of a single one-byte step of FCS computation is $FCS(s_0, b_1, \ldots, b_t, b_{t+1}) = FCS(s_0, b_1, \ldots, b_t) \times M + b_{t+1} \times M^*$, where M is a 32×32 binary matrix and $M^*$ is its 8×32 sub-matrix. After d iterations (for new d input bytes $b_{t+1}, \ldots, b_{t+d}$), the expression might be expanded as $FCS(s_0, b_1 \ldots, b_t, b_{t+1}, \ldots, b_{t+d}) = FCS(s_0, b_1 \ldots, b_t) \times M^d + b_{t+1} \times (M^* \times M^{d-1}) + b_{t+2}(M^* \times M^{d-2}) + \ldots + b_{t+d} \times (M^* \times M^0)$. In this expanded expression, each product of $M^*$ and powers of M has 8 rows and 32 columns. The expanded expression might be interpreted as a concatenated (32+8d)-bit input vector, $\{FCS(s_0, b_{t+1}, \ldots, b_{t+d}\}$, multiplied by an extended CRC transition matrix $M^{CRC}$ with (32+8d) rows and 32 columns, where the matrix $M^{CRC}$ is a vertical concatenation of $M^d$ and the products of $M^* \times M^i$, $i = d-1, d-2, \ldots, 0$.

Suppose after processing the t bytes of data, it is only possible to process K more input bytes (e.g., $x_1 \ldots x_K$), that is, subsequent state vector $s_{t+K}$ is computed as $FCS(s_t, b_1, \ldots, b_t, x_1, \ldots, x_K)$. If the process actually needs to compute d bytes instead of K bytes, and d<K, a post-processing correction is applied. For example, since $FCS(s_0, b_1 \ldots, b_t, 0) = FCS(s_0, b_1 \ldots, b_t) \times M$, then $FCS(s_0, b_1, \ldots, b_t) = FCS(s_0, b_1, \ldots, b_t, 0) \times M^{-1}$, provided that the determinant of matrix M is not equal to 0. Therefore, embodiments might process d bytes, where d is less than a maximum number of bytes K, by setting $x_1 = b_{t+1}$; $x_2 = b_{t+2}$; ...; $X_d = b_{t+d}$; and $x_{d+1}$, $x_{d+2}, \ldots, x_{K-1}, x_K = 0$, to compute a new state vector $s_{t+d}$ as $s_{t+K} \times M^{d-K}$. The same computation supports full input blocks (d=K) because in this example $s_{t+K} \times M^{d-K} = s_{t+K} \times M^0 = s_{t+K}$. The computation also supports the case where d=0 (e.g., this case might be interpreted as an empty current block). In this case, all inputs $x_1, \ldots, x_K$ might be set to 0, and $s_t$ might be restored from $s_{t+K}$ as $s_t = s_{t+K} \times M^{-K}$.

FCS module 100 (accompanied with switch 110 and controller 112) might implement the preceding state vector computation. Controller 112 might organize data flow and schedule processing so that so that FCS module 100 process up to K bytes of data in one clock cycle. Switch 110 serves to reconcile data and/or commands between controller 112 and FCS module 100. In particular, switch 110 might provide input $s_{in}$ set to a predefined constant for the first block of frame check sequence, or switch 110 might provide input $s_{in}$ set to the feedback value $s'_{new}$ for the subsequent blocks. After the last block of frame check sequence is processed, switch 110 might build the FCS output from the last value of $s'_{new}$. Also, switch 110 might transfer parts of input signal data to $x_1, x_2, \ldots, x_{K-1}, x_K$ with appropriate padding (masking). Although not shown in FIG. 1, controller 112 and switch 100 might be coupled to memory to store and retrieve data and commands. For example, controller 112 might retrieve matrices from memory for FCS module 100. FCS module might implement constant matrices to support an individual CRC/FCS standard, and FCS module might also implement downloadable matrices retrieved by controller 112 from memory. Controller 112 and switch 110 might also transfer data and commands between external processors in a multi-processor environment. For example, switch 110 might receive data to be processed by FCS module 100 from an external module, and controller 112 might be configured to receive control commands from an external module. Controller 112 might also provide indications to external modules, for example, by providing state flags corresponding to the status of processing in FCS module 100. When processing in FCS module 100 is completed and a final CRC value is generated, switch 110 might receive the CRC value and transfer it to an external processor for error-checking.

State vector $s_t$ might correspond to signal $s_{in}$ in FIG. 1, state vector $s_{t+K}$ might correspond to signal $v_{out}$ in FIG. 1, and state vector $s_{t+d}$ might correspond to signal $s_{new}$ (and its registered variant $s'_{new}$) in FIG. 1. In embodiments of the present invention, pre-processing might occur before a block of data bytes is input into CRC unit 102. For example, suppose an input block of bytes with width d is shorter than the maximum width K bytes. In this example, the block might be padded with K−d bytes (e.g., bytes equal to logic '0') so that the width of the expanded data block is equal to K bytes. After a data block is padded so that it has K bytes, the block's bytes $x_1 \ldots x_k$ might be input into CRC unit 102 for a pass of FCS module 100. Each pass of FCS module 100 generates a state vector (denoted as signal $s_{new}$ in FIG. 1). CRC unit 102 computes a 32-bit internal vector value (denoted as signal $v_{out}$ in FIG. 1) from a 32-bit state vector input (denoted as signal $s_{in}$ in FIG. 1) and 8 K input bits (8-bit bytes are denoted as $x_1 \ldots x_K$ in FIG. 1). CRC unit 102 multiplies, using modulo 2 multiplication, the K+4 byte long concatenation of $(s_{in}, x_1, \ldots, x_K)$ by the above-mentioned matrix $M^{CRC}$ with 32 columns and 8 K+32 rows. CRC unit 102 might implement the computation of internal vector signal $v_{out}$ expressed as: $s_{in} \times M^K + x_1 \times (M^* \times M^{K-1}) + x_2 \times (M^* \times M^{K-2}) + \ldots + x_K \times (M^* \times M^0)$, where $M^*$ is a sub-matrix of M and $v_{out}$ is computed using modulo 2 arithmetic. In some embodiments, the 32-bit state vector input signal $s_{in}$ might be retrieved from register 108. State vector input signal $s_{in}$ might also be a given constant, for example, when CRC unit 102 computes the first iteration of an FCS computation. The selection between the constant and the vector from register 108 might be performed by switch 110 and controlled by controller 112.

Figure 4:
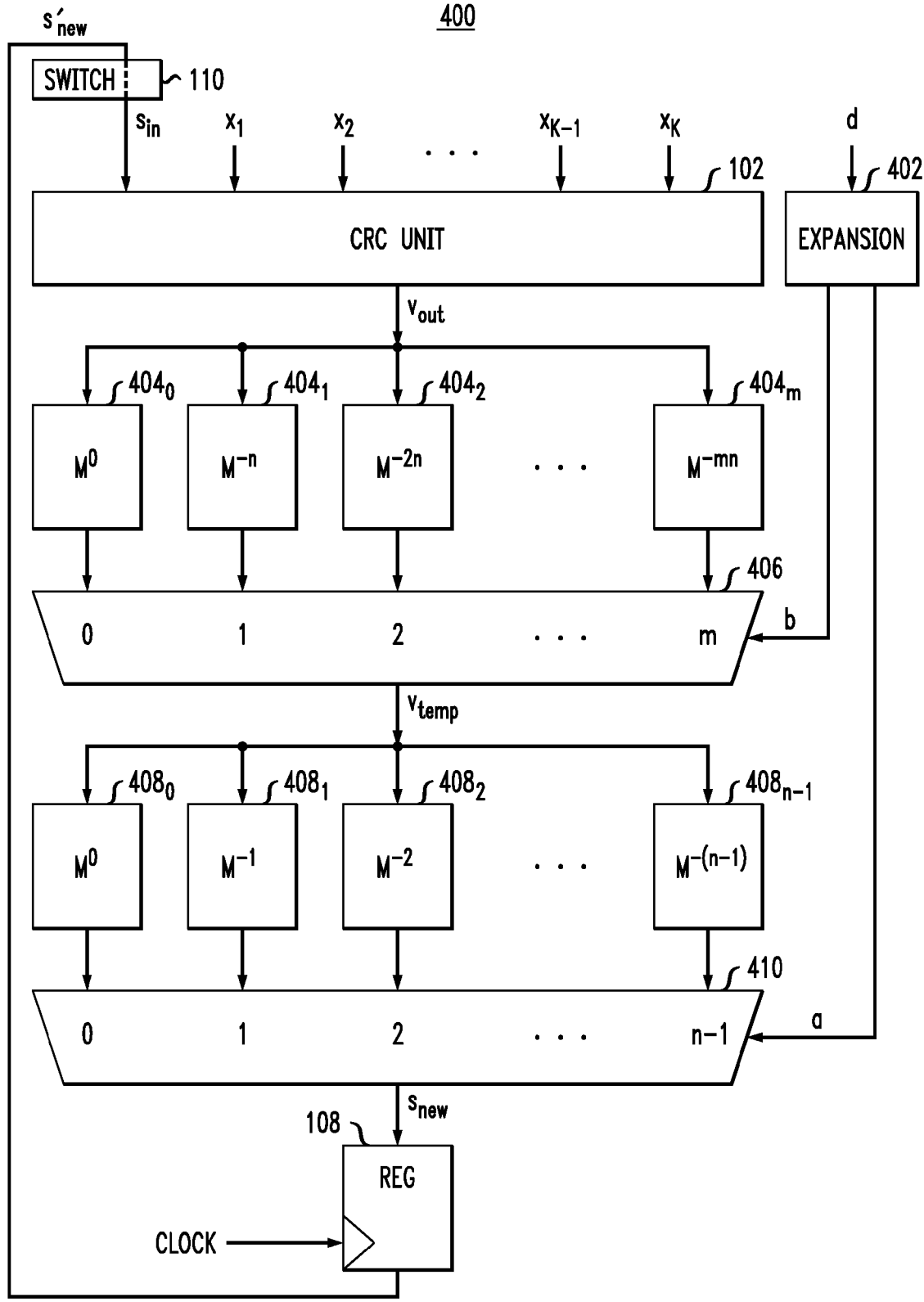
FIG. 4 shows a block diagram of an exemplary expanded frame check sequence module in accordance with exemplary embodiments of the present invention.

The block diagram of FIG. 1 shows matrix units $104_0$-$104_K$ which FCS module 100 uses to implement the correction step so that FCS module 100 might support input data blocks with widths shorter than K bytes. In the embodiment of FIG. 1, matrix units $104_0$-$104_K$ comprise a complete set of matrix units. In other embodiments, such as shown in FIG. 4, one set of matrix units $104_0$-$104_K$ do not form a complete set, and correction is performed in more than one step. In embodiments of the present invention, the correction step is implemented by multiplying the 32-bit internal vector signal $v_{out}$ by a correction matrix $M^{corr}$. The matrix $M^{corr}$ has 32 rows and 32(K+1) columns, and consists of sub-matrices $M^0$, $M^{-1}$, $M^{-2}, \ldots, M^{-K}$ that are placed side-by-side as shown in matrix units $104_0$-$104_K$ of FIG. 1. In embodiments of the present invention, matrix units $104_0$-$104_K$ implement modulo 2 multiplication of 32-bit vector signal $v_{out}$ and respective (32×32)-matrices $M^0$, $M^{-1}$, $M^{-2}, \ldots, M^{-K}$. The (32(K+1))-bit result of matrix units $104_0$-$104_K$ might be sent to multiplexer 106, where the 32-bit state vector $s_{new}$ is selected for storage in register 108. The state vector signal $s_{new}$ is selected according to a control signal from controller 112 to multiplexer 106 (shown as d in FIG. 1), where d corresponds to the current data block's original width. If the block of the input bytes is not padded because original width d equals the maximum number of bytes K, then $s_{new} = v_{out}$ (since multiplication on the identity matrix $M^0$ leaves a vector unchanged). From register 108, state vector signal $s'_{new}$ might be retrieved and input into CRC unit 102 as state vector signal $s_{in}$ for another pass of FCS processing. State vector signal $s'_{new}$ might also represent the final CRC value, and thus might be transferred to an external module by switch 110 for error-checking. In other embodiments, the final CRC value might be produced from state vector signal $s'_{new}$ by a transformation, such as a bitwise complement, before being retrieved by an external module for error-checking.

As shown in the embodiment of FIG. 1, FCS module 100 might have a number of gates proportional to the maximum width K of an input data block. For example, the largest part of FCS module 100 might be the matrix units $104_0$-$104_K$ because they implement multiplications of 32-bit vectors by varying 32×32 matrices. The number of valid input bytes d might vary from 0 to K with every clock cycle. Input bytes that are not part of the d valid input bytes are zero-padded. The exemplary embodiment of FCS module 100 might allow up to K=32 bytes (256 bits) of data to be processed in one clock cycle. For example, state vector $s_{new}$ might be computed from a previous state vector $s_{in}$ and d data bytes $x_1, \ldots, x_d$ inside of one clock cycle.

Figure 2:
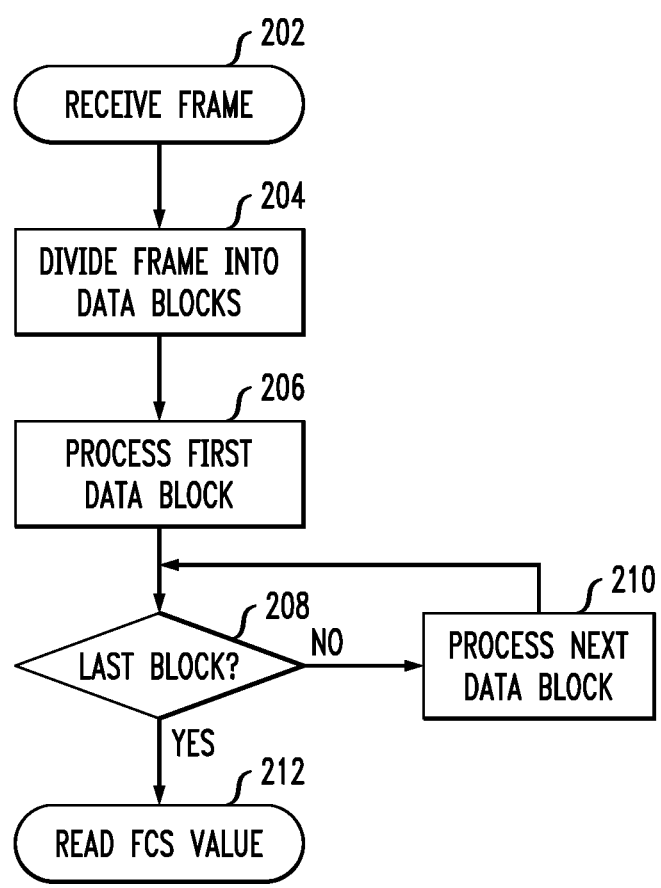
FIG. 2 shows a flow diagram of a process for frame check sequence computations in accordance with embodiments of the present invention.

FIG. 2 shows a flow diagram of FCS process 200 in accordance with embodiments of the present invention. At step 202, a frame of data bytes is received. At step 204, the frame is divided into data blocks. A data block might have an original width of d bytes that is equal to or less than a predetermined maximum width K. At step 206, a first data block of the frame is processed by FCS module 100. At step 208, a test determines the current block is the last block of the frame. If the test at 208 determines that the current block is not the last block, the process advances to step 210 where the next block is processed by FCS module 100. When the last block of the frame is processed, the test at step 208 determines that the current block is the last block and the process advances to step 212. At step 212, the FCS value is read for error-checking.

Figure 3:
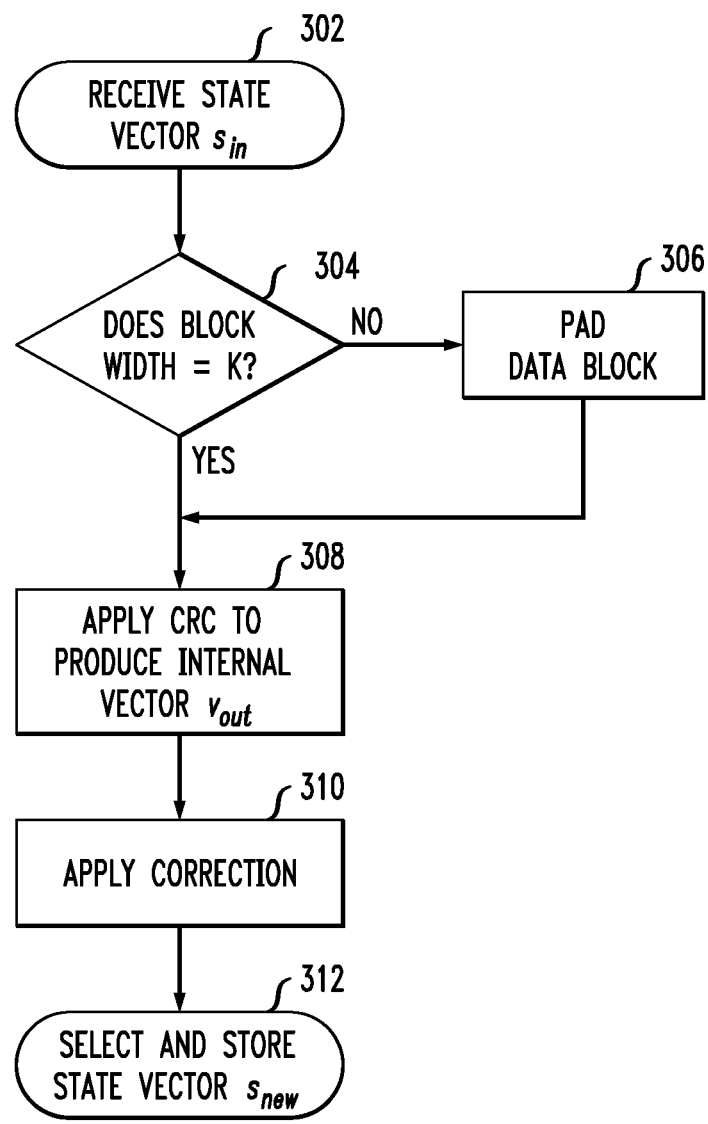
FIG. 3 shows a flow diagram of a process for one data block computation in accordance with embodiments of the present invention.

FIG. 3 shows a flow diagram of FCS sub-process 300 in accordance with embodiments of the present invention. FCS sub-process 300 provides details for steps 206 and 210 in FCS process 200. FCS sub-process 300 shows steps for processing a data block during a pass, for example, of FCS module 100. At step 302, an input state vector $s_{in}$ is received, for example, by FCS module 100. At step 304, a test determines whether a block's width is equal to a predetermined maximum width K. If the test at step 304 determines that the data block's original width is equal to K, the data block might be sent to CRC unit 102 for processing. If the test at step 304 determines that the data block's width is not equal to K, the process advances to step 306. At step 306, the data block is padded with zeroes until the new width of the data block is equal to K bytes.

At step 308, a CRC function is applied to the data block and input state vector $s_{in}$ to produce internal vector $v_{out}$. For example, the CRC function might be applied at CRC unit 102. At step 310, internal vector $v_{out}$ is corrected, for example, by employing matrix units $104_0$-$104_K$. After correction and at step 312, state vector $s_{new}$ is selected and stored in register 108. A pass is complete at step 312.

FIG. 4 shows a block diagram of expanded FCS module 400 in accordance with exemplary embodiments of the present invention. Expanded FCS module 400 might implement the preceding state vector computations by using another state vector computation. As discussed above, a state vector $s_{t+d}$ might be computed as $s_{t+K} \times M^{d-K}$. Suppose there is an integer parameter n such that n>1, and the difference K−d between maximum data block width K and an input data block's width d (0≤K−d≤K) is integer divided by n to produce a ratio b and a remainder a, such that K−d=a+bn. Stated another way, remainder a=(K−d) mod n and ratio b=⌊(K+d)/n⌋, where notation ⌊x⌋ denotes the largest integer which is less than or equal to a real number x. Using the values a and b, the computation of $s_{t+K} \times M^{d-K}$ might be split into two steps by: 1) computing an internal vector $v_{temp}$ which equals $s_{t+K} \times (M^{-n})^b$; and 2) computing $s_{t+d}$ as $s_{t+d} = v_{temp} \times (M^{-1})^a$.

Expanded FCS module 400 might implement the preceding state vector computations. For example, state vector $s_t$ might correspond to signal $s_{in}$ in FIG. 4, state vector $s_{t+K}$ might correspond to signal $v_{out}$ in FIG. 4, state vector $s_{t+d}$ might correspond to signal $s_{new}$ (and its registered variant $s'_{new}$) in FIG. 4, and internal vector $v_{temp}$ might correspond to signal $v_{temp}$ in FIG. 4. Expanded FCS module 400 contains expansion unit 402 which provides a control signal to multiplexer 406 (denoted as b in FIG. 4) and provides a control signal to multiplexer 410 (denoted as a in FIG. 4). For example, expansion unit 402 might receive a control signal (denoted as d in FIG. 4) which corresponds to an input data block's width d. Expansion unit 402 computes control signal b for multiplexer 406 by computing an integer division of K−d by an integer n. Control signal b allows internal vector signal $v_{temp}$ to be selected by multiplexer 406 such that $v_{temp} = v_{out} \times (M^{-n})^b$.

As shown in the exemplary embodiment of FIG. 4, the modulo 2 multiplication of internal vector signal $v_{out}$ by $(M^{-n})^b$ occurs at matrix units $404_0$-$404_m$. Matrix units $404_0$-$404_m$ and matrix units $408_0$-$408_{n-1}$ form the complete set of matrix units in the embodiment shown in FIG. 4. Following the multiplication, the product is sent to multiplexer 406 where a 32-bit internal vector $v_{temp}$ is output. Internal vector $v_{temp}$ is multiplied by $(M^{-1})^a$ at matrix units $408_0$-$408_{n-1}$, and then the product is sent to multiplexer 410. Based on control signal a, computed at expansion unit 402, multiplexer 410 selects the 32-bit state vector signal $s_{new}$ to be stored in register 108. Expansion unit 402 computes control signal a for multiplexer 406 by computing the remainder (K−d) mod n. From register 108, state vector $s'_{new}$ might be retrieved and input into CRC unit 102 as state vector signal $s_{in}$ for further FCS processing. State vector $s'_{new}$ might also represent the final CRC value, and thus might be retrieved by an external module for error-checking.

The exemplary embodiment represented by FIG. 4 might reduce the gate count. The slight increase in depth embodied in expanded FCS module 400 might be mitigated because the small design might result in shorter wire connections and a decreased fan-out of gates. The integer parameter n that expansion unit 402 uses might affect the total gate count and delay of expanded FCS module 400. In embodiments of the present invention, the integer parameter n might be chosen approximately equal to the square root of maximum data block width K.

FIG. 1 shows an exemplary embodiment of the invention with one level of correction (represented by matrix units $104_0$-$104_K$). FIG. 4 shows an exemplary embodiment of the invention with two levels of correction (one level represented by matrix units $404_0$-$404_m$ and the second level represented by matrix units $408_0$-$408_{n-1}$). Certain embodiments might implement further decomposition and have more than two levels of correction.

Different embodiments of the present invention might also accept input data widths having different granularity. Throughout the specification the original input data width d has been described in terms of a number of bytes (where the granularity is equal to 8 bits), although the invention is not limited to input data widths having a granularity of 8 bits. For example, the input data block width d might be limited to an even number of bytes, in which case the granularity would be 2 bytes (16 bits). In this example, FCS module 100 needs half as many matrix units $104_0$-$104_K$ because $104_1$, $104_3$, $104_5$, etc. correspond to an odd number of d bytes, and thus they could be removed from FCS module 100 when d is even. Similarly, in embodiments in which input data block width d is always a multiple of 4 bytes (where the granularity is equal to 32 bits), for example, FCS module 100 needs one-fourth as many matrix units $104_0$-$104_K$ as compared to embodiments with an input data width granularity of 8 bits. Embodiments with an expansion unit such as expanded FCS module 400 also might accept input data block widths with varying granularities. In some embodiments, the input data blocks have a width d with granularities less than 1 byte, such as a half byte or 1 bit. For example, an input data width of 1 bit might result in additional matrix units as compared to embodiments with an input data width granularity of 1 byte.

An FCS module adapted to perform CRC operations in accordance with exemplary embodiments of the present invention provides for the following advantages. The FCS module architecture allows high throughput CRC processing of input data blocks having variable widths. For example, the FCS module architecture can process an input data block having 32 bytes (256 bits) in one clock cycle. Embodiments of the invention enable the number of input bytes to be varied with every new frame and also with every clock cycle. Additionally, the FCS module architecture allows a computed CRC value to be available without extra latency and within the same clock cycle as when the last input block was received. Embodiments also permit the use of both constant matrices and downloadable matrices, allowing a more flexible design.

Reference herein to "one embodiment" or "an embodiment" means that a particular feature, structure, or characteristic described in connection with the embodiment can be included in at least one embodiment of the invention. The appearances of the phrase "in one embodiment" in various places in the specification are not necessarily all referring to the same embodiment, nor are separate or alternative embodiments necessarily mutually exclusive of other embodiments. The same applies to the term "implementation."

While the exemplary embodiments of the present invention have been described with respect to processing in hardware, including possible implementation as a single integrated circuit, a multi-chip module, a single card, or a multi-card circuit pack, the present invention is not so limited. As would be apparent to one skilled in the art, various functions of hardware may also be implemented in a software program. Such software may be implemented as steps performed by, for example, a digital signal processor, micro-controller, or general purpose computer.

The present invention can be embodied in the form of methods and apparatuses for practicing those methods. The present invention can also be embodied in the form of program code embodied in tangible media, such as magnetic recording media, optical recording media, solid state memory, floppy diskettes, CD-ROMs, hard drives, or any other non-transitory machine-readable storage medium, wherein, when the program code is loaded into and executed by a machine, such as a computer, the machine becomes an apparatus for practicing the invention. The present invention can also be embodied in the form of program code, for example, whether stored in a non-transitory machine-readable storage medium, loaded into and/or executed by a machine, or transmitted over some transmission medium or carrier, such as over electrical wiring or cabling, through fiber optics, or via electromagnetic radiation, wherein, when the program code is loaded into and executed by a machine, such as a computer, the machine becomes an apparatus for practicing the invention. When implemented on a general-purpose processor, the program code segments combine with the processor to provide a unique device that operates analogously to specific logic circuits. The present invention can also be embodied in the form of a bitstream or other sequence of signal values electrically or optically transmitted through a medium, stored magnetic-field variations in a magnetic recording medium, etc., generated using a method and/or an apparatus of the present invention.

It should be understood that the steps of the exemplary methods set forth herein are not necessarily required to be performed in the order described, and the order of the steps of such methods should be understood to be merely exemplary. Likewise, additional steps may be included in such methods, and certain steps may be omitted or combined, in methods consistent with various embodiments of the present invention.

As used herein in reference to an element and a standard, the term "compatible" means that the element communicates with other elements in a manner wholly or partially specified by the standard, and would be recognized by other elements as sufficiently capable of communicating with the other elements in the manner specified by the standard. The compatible element does not need to operate internally in a manner specified by the standard.

Also for purposes of this description, the terms "couple," "coupling," "coupled," "connect," "connecting," or "connected" refer to any manner known in the art or later developed in which energy is allowed to be transferred between two or more elements, and the interposition of one or more additional elements is contemplated, although not required. Conversely, the terms "directly coupled," "directly connected," etc., imply the absence of such additional elements. Signals and corresponding nodes or ports may be referred to by the same name and are interchangeable for purposes here. It will be further understood that various changes in the details, materials, and arrangements of the parts which have been described and illustrated in order to explain the nature of this invention may be made by those skilled in the art without departing from the scope of the invention as expressed in the following claims.

We claim:

1. A method of processing a byte sequence into a cyclic redundancy check (CRC) value in a current pass, the method comprising:
    dividing the byte sequence into blocks in one clock cycle, each block having a corresponding original width;
    if a block's original width is less than a maximum number of bytes, padding the block until a new width is equal to the maximum number of bytes;
    based on a first state vector and the padded block, computing, by a CRC unit, a first internal vector;
    generating, by multiplying the internal vector by one or more first correction matrices, a first set of products; and
    if the one or more first correction matrices form a complete set, selecting, in the one clock cycle, by a first control signal determined by the original width, a second state vector from the first set of products,
    wherein the method is implemented as steps executed by a system-on-chip (SoC) network processor.

2. The method of claim 1, wherein the first state vector, the first internal vector, the second state vector, and the CRC value are each comprised of 32 bits.

3. The method of claim 1, the method further comprising: storing the second state vector in a register.

4. The method of claim 3, the method further comprising:
    retrieving the second state vector from the register;
    combining the second state vector with the first state vector; and
    repeating the computing, generating, and selecting for a subsequent pass.

5. The method of claim 1, wherein the maximum number of bytes is equal to 32 bytes.

6. The method of claim 1, wherein, if the one or more first correction matrices are not the complete set, the complete set further comprising one or more second correction matrices, the method further comprising:

computing a ratio b and a remainder a by:
  subtracting the original width from the maximum number of bytes, wherein the subtraction results in a difference; and
  dividing the difference by an integer parameter n.

7. The method of claim 6, the method further comprising:
  selecting, by the first control signal further determined by the ratio b, a second internal vector from the first set of products;
  generating, by multiplying the second internal vector by the one or more second correction matrices, a second set of products; and
  selecting, by a second control signal determined by the remainder a, the second state vector from the second set of products.

8. A system-on-chip (SoC) network processor having a frame check sequence (FCS) module comprising:
  a cyclic redundancy check (CRC) unit configured to receive a data block having a corresponding original width in one clock cycle, and compute a first internal vector based on a first state vector;
  a set of first matrix units, each configured to multiply the first internal vector by a corresponding first correction matrix in parallel, wherein the multiplications result in a first set of products; and
  a first multiplexer configured to select, in the one clock cycle, if the set of first matrix units forms a complete set and by a control signal determined by the original width, a second state vector from the first set of products.

9. The apparatus of claim 8, wherein the first state vector, the first internal vector, the second state vector, and the CRC value are each comprised of 32 bits.

10. The apparatus of claim 8, the invention further comprising a register configured to store the second state vector.

11. The apparatus of claim 10, the CRC unit further configured to:
  retrieve the second state vector from the register;
  combine the second state vector with the first state vector for a subsequent pass.

12. The apparatus of claim 8, wherein the maximum number of bytes is equal to 32 bytes.

13. The apparatus of claim 8, wherein, if the set of first matrix units are not the complete set, the complete set further comprising a set of second matrix units, the apparatus further comprising:
  an expansion unit configured to compute a remainder a and a ratio b based on the maximum number of bytes and the original width, wherein a second internal vector is further determined by the ratio b; and
  a second multiplexer configured to select, by a second control signal determined by the remainder a, the second state vector from a second set of products, wherein
  the set of second matrix units are each configured to multiply the second internal vector by a corresponding second correction matrix in parallel, wherein the multiplications result in the second set of products.

14. The apparatus of claim 13, the invention further comprising:
  a register configured to store the second state vector, wherein the second state vector is comprised of 32 bits.

15. A non-transitory, machine-readable storage medium, having encoded thereon program code, wherein, when the program code is executed by a machine, the machine implements a method for processing a byte sequence into a cyclic redundancy check (CRC) value in a current pass, the method comprising:
  dividing the byte sequence into blocks in one clock cycle, each block having a corresponding original width;
  if a block's original width is less than a maximum number of bytes, padding the block until a new width is equal to the maximum number of bytes;
  based on a first state vector and the padded block, computing, by a CRC unit, a first internal vector;
  generating, by multiplying the first internal vector by one or more first correction matrices, a first set of products; and
  if the one or more first correction matrices form a complete set, selecting, in the one clock cycle, by a first control signal determined by the original width, a second state vector from the first set of products,
  wherein the non-transitory, machine-readable storage medium is implemented in a system-on-chip (SoC) network processor.

16. The non-transitory, machine-readable storage medium of claim 15, further comprising:
  storing the second state vector in a register;
  retrieving the second state vector from the register;
  combining the second state vector with the first state vector; and
  repeating the computing, multiplying, and selecting for a subsequent pass.

17. The non-transitory, machine-readable storage medium of claim 15, wherein the maximum number of bytes is equal to 32 bytes.

18. The non-transitory, machine-readable storage medium of claim 15, wherein, if the one or more first correction matrices are not the complete set, the complete set further comprising one or more second correction matrices, the method further comprising:
  computing a ratio b and a remainder a by:
    subtracting the original width from the maximum number of bytes, wherein the subtraction results in a difference; and
  dividing the difference by an integer parameter n.

19. The non-transitory, machine-readable storage medium of claim 18, the method further comprising:
  selecting, by the first control signal further determined by the ratio b, a second internal vector from the first set of products;
  generating, by multiplying the second internal vector by the one or more second correction matrices, a second set of products; and
  selecting, by a control signal determined by the remainder a, the second state vector from the second set of products.

* * * * *